(12) United States Patent
Kim et al.

(10) Patent No.: US 8,829,068 B2
(45) Date of Patent: Sep. 9, 2014

(54) POLYMER AND PHOTOSENSITIVE RESIN COMPOSITION COMPRISING THE SAME

(75) Inventors: Sunhwa Kim, Daejeon (KR); Ho Chan Ji, Daejeon (KR); Dongchang Choi, Daejeon (KR); Han Soo Kim, Daejeon (KR); Yoon Hee Heo, Daejeon (KR); Changho Cho, Anseong-si (KR); Won Jin Chung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/452,456

(22) Filed: Apr. 20, 2012

(65) Prior Publication Data
US 2013/0030077 A1    Jan. 31, 2013

(30) Foreign Application Priority Data
Apr. 21, 2011  (KR) .................. 10-2011-0037474

(51) Int. Cl.
*A61F 2/08* (2006.01)
*C08F 32/00* (2006.01)
*C08F 10/00* (2006.01)

(52) U.S. Cl.
USPC ............ 522/79; 526/262; 526/308; 526/309; 526/282

(58) Field of Classification Search
USPC .................. 522/79; 526/262, 308, 309, 282
See application file for complete search history.

(56) References Cited

U.S. PATENT DOCUMENTS

2008/0145783 A1*  6/2008  Cho et al. .................. 430/280.1
2008/0299503 A1* 12/2008  Ishiduka et al. ............. 430/325
2010/0105793 A1    4/2010  Lee et al.

FOREIGN PATENT DOCUMENTS

WO     WO 2008/088160    *  7/2008   ............. C08F 20/00

OTHER PUBLICATIONS

ALS Environmental, "CAS 103-11-7: 2-Ethyl Hexyl Acrylate" (no date).*

* cited by examiner

*Primary Examiner* — Michael Pepitone
*Assistant Examiner* — Jessica Roswell
(74) *Attorney, Agent, or Firm* — Rothwell, Figg, Ernst & Manbeck, P.C.

(57) ABSTRACT

The present invention relates to a polymer having a novel structure and a photosensitive resin composition comprising the same. A photosensitive resin composition comprising a polymer according to the present invention has a high taper angle and excellent adhesion strength. Accordingly, the photosensitive resin composition comprising the polymer according to the present invention may be applied to various photosensitive materials, and particularly, may be preferably applied when a color filter pattern for LCD is manufactured.

13 Claims, 6 Drawing Sheets

POLYMER AND PHOTOSENSITIVE RESIN COMPOSITION COMPRISING THE SAME

TECHNICAL FIELD

This application claims priority from Korean Patent Application No. 10-2011-0037474 filed on Apr. 21, 2011, in the KIPO, the disclosure of which is incorporated herein by reference in its entirety.

The present invention relates to a polymer having a novel structure and a photosensitive resin composition comprising the same. More particularly, the present invention relates to a polymer improving photosensitivity and a developing property of a photosensitive resin composition, and a photosensitive resin composition comprising the same.

BACKGROUND ART

A photosensitive resin composition may be used to form a pattern by forming a coat by applying the photosensitive resin composition on a substrate, performing exposure on a predetermined portion of the coat by using a photomask and the like by light radiation, and removing a non-exposure portion by a developing treatment.

Since the photosensitive resin composition can be polymerized and cured by radiating light, the photosensitive resin composition is used for photocurable ink, a photosensitive printed board, various photoresists, a color filter photoresist for LCD, a photoresist for black matrixes, a transparent photosensitive material and the like.

DISCLOSURE

Technical Problem

In the art, there is a need for studying a photosensitive resin composition improving a photosensitivity and developing property, having excellent adhesion strength to a substrate, and applied to various photosensitive materials.

Technical Solution

An exemplary embodiment of the present invention provides a polymer comprising:

1) a repeating unit represented by the following Formula 1;

2) a repeating unit represented by the following Formula 2;

3) a repeating unit represented by the following Formula 3; and 4) one or more of repeating units represented by the following Formula 4, Formula 5 and Formula 6.

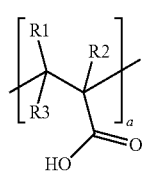

[Formula 1]

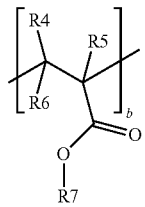

[Formula 2]

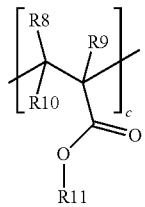

[Formula 3]

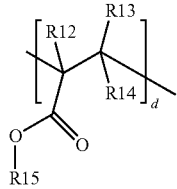

[Formula 4]

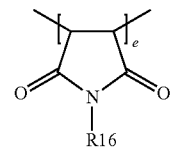

[Formula 5]

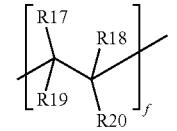

[Formula 6]

In Formula 1 to Formula 6,

R1, R2, R3, R4, R5, R6, R8, R9, R10, R12, R13, R14, R17, R18 and R19 are the same as or different from each other, and each independently hydrogen or a $C_1$ to $C_{12}$ alkyl group, R7 is a $C_8$ to $C_{18}$ alkyl group, R11 is a dicyclopentanyl group, a dicyclopentenyl group, a dicyclopentenyloxyethyl group, an adamantyl group or an isobornyl group, R15 is a $C_1$ to $C_{12}$ alkyl group which is unsubstituted or substituted by halogen, a $C_6$ to $C_{20}$ aryl group or a $C_1$ to $C_{12}$ alkoxy group; a $C_1$ to $C_3$ alkoxy poly (n=2 to 30) alkyleneglycol group; or a $C_6$ to $C_{20}$ aryl group which is unsubstituted or substituted by halogen, a $C_1$ to $C_{12}$ alkyl group or a $C_1$ to $C_{12}$ alkoxy, R16 is a $C_1$ to $C_{12}$ alkyl group which is unsubstituted or substituted by halogen, a $C_6$ to $C_{20}$ aryl group or a $C_1$ to $C_{12}$ alkoxy group; a $C_1$ to $C_{12}$ alkylester group; or a $C_6$ to $C_{20}$ aryl group which is unsubstituted or substituted by halogen, a $C_1$ to $C_{12}$ alkyl group, a $C_6$ to $C_{20}$ aryl group or a $C_1$ to $C_{12}$ alkoxy, R20 is a $C_6$ to $C_{20}$ aryl group which is unsubstituted or substituted by halogen, a $C_1$ to $C_{12}$ alkyl group, a $C_6$ to $C_{20}$ aryl group or a $C_1$ to $C_{12}$ alkoxy group, a is 10 to 60, b is 10 to 60, c is 10 to 60, d is 0 to 90, e is 0 to 30, f is 0 to 30, and at least one of d, e and f is more than 0.

Another exemplary embodiment of the present invention provides a photosensitive resin composition comprising a binder resin comprising the polymer, a polymerizable compound comprising an ethylenically unsaturated bond, a photoinitiator and a solvent.

Yet another exemplary embodiment of the present invention provides a photosensitive material comprising the photosensitive resin composition.

Advantageous Effects

A photosensitive resin composition comprising a polymer according to an exemplary embodiment of the present invention has a high taper angle and excellent adhesion strength. Accordingly, the photosensitive resin composition comprising the polymer according to the exemplary embodiment of the present invention may be applied to various photosensitive materials, and particularly, may be preferably applied when a color filter pattern for an LCD is manufactured.

BEST MODE

Figure 1:
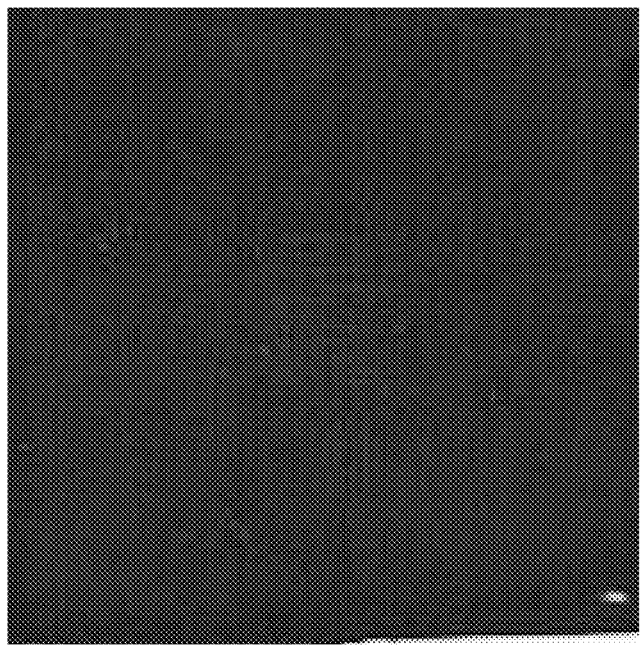
FIG. 1 is a view illustrating a test result of adhesion strength of a film according to Example 1 of the present invention.

Hereinafter, the present invention will be described in more detail. In the case of currently developed portable LCD display products, a picture quality is an important characteristic. A size of a pattern to be implemented by a color filter should be reduced for high resolution display. In that case, the pattern is easily eliminated, and a CD (critical dimension) deviation by a process is increased according to a shape of an end of the pattern. Elimination of the pattern or the CD deviation causes production of defect products.

Particularly, in the case of a black matrix, if a taper of a pattern is low, a thickness difference is increased in one pattern, and OD (optical density) is reduced for a small thickness, resulting in a reduction of blocking effect of light. Accordingly, in the high resolution photoresist, the shape of the pattern is a very important element.

The present invention has been made in an effort to provide a polymer having a high taper angle and excellent adhesion strength of a photosensitive resin composition, and a photosensitive resin composition comprising the same.

A polymer according to the present invention comprises 1) a repeating unit represented by Formula 1; 2) a repeating unit represented by Formula 2; 3) a repeating unit represented by Formula 3; and 4) one or more of repeating units represented by Formula 4, Formula 5 and Formula 6.

In the polymer according to the present invention, substituent groups of Formula 1 to Formula 6 will be described in more detail below.

Examples of the halogen group may comprise fluorine, chlorine, bromine, iodine and the like, but are not limited thereto.

An alkyl group may be a straight chain or a branched chain, and specific examples thereof comprise a methyl group, an ethyl group, a propyl group, an isopropyl group, a butyl group, a t-butyl group and the like, but are not limited thereto.

Specific examples of the alkoxy group may comprise a methoxy group, an ethoxy group, an isopropyloxy group and the like, but are not limited thereto.

The aryl group may be a monocycle or polycycle, and the number of carbon atoms is not particularly limited but is preferably 6 to 20. Examples of the monocyclic aryl group may comprise a phenyl group, a biphenyl group, a terphenyl group, stilben and the like, and examples of the polycyclic aryl group may comprise a naphthyl group, an anthracenyl group, a phenanthrene group, a pyrenyl group, a perylenyl group, a cryxenyl group, a fluorene group and the like, but are not limited thereto.

The polymer according to the present invention may be represented by the following Formula 7, but is not limited thereto.

[Formula 7]

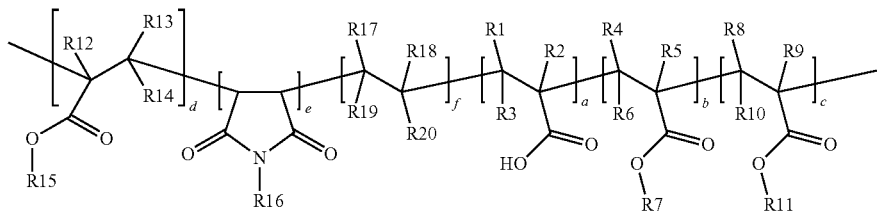

In Formula 7, R1 to R20, and a to f are the same as definitions of Formula 1 to Formula 6.

Physical properties such as compatibility and heat resistance of the polymer according to the present invention may be controlled by controlling a structure, a ratio and the like of the repeating units represented by Formulas 1 to 6.

An acid value of the polymer may be in the range of about 30 to 300 KOH mg/g, or in the range of about 50 to 120 KOH mg/g. Further, a weight average molecular weight of the polymer may be in the range of 5,000 to 50,000, or in the range of 7,000 to 30,000.

A method of manufacturing the polymer according to the present invention is described in detail in Synthetic Example to be described below.

Further, the photosensitive resin composition according to the present invention comprises a binder resin comprising the polymer, a polymerizable compound comprising an ethylenically unsaturated bond, a photoinitiator and a solvent.

In the photosensitive resin composition according to the present invention, the binder resin may comprise the polymer alone, or may further comprise an alkali-soluble resin known in the art.

In the photosensitive resin composition according to the present invention, it is preferable that the content of the binder resin be 1 to 20 wt % based on the total weight of the photosensitive resin composition, but is not limited thereto.

In the photosensitive resin composition according to the present invention, examples of the polymerizable compound comprising the ethylenically unsaturated bond may comprise one or more selected from the group consisting of a compound obtained by esterifying polyhydric alcohols such as ethyleneglycol di(metha)acrylate, polyethylene glycol di(metha)acrylate having 2 to 14 ethylene groups, trimethylolpropane di(metha)acrylate, trimethylolpropane tri(metha)acrylate, pentaerythritol tri(metha)acrylate, pentaerythritol tetra(metha)acrylate, propylene glycol di(metha)acrylate having 2 to 14 propylene groups, dipentaerythritol penta(metha)acrylate, and dipentaerythritol hexa(metha)acrylate by α,β-unsaturated carboxylic acid; a compound obtained by adding (metha)acrylic acid to a compound comprising a glycidyl group such as a trimethylolpropanetriglycidylether acrylate addition product and a bisphenol A diglycidylether acrylate addition product; an ester compound of a compound having a hydroxyl group or an ethylenically unsaturated bond and polyhydric carboxilic acids, or an addition product with polyisocyanate, such as diester phthalate of β-hydroxyethyl (metha)acrylate and toluene diisocyanate addition product of β-hydroxyethyl(metha)acrylate; and alkylester (metha)acrylate such as methyl(metha)acrylate, ethyl(metha)acrylate, butyl(metha)acrylate, and 2-ethylhexyl(metha)acrylate, but are not limited thereto, and matters known in the art may be used.

The content of the polymerizable compound comprising the ethylenically unsaturated bond is preferably 1 to 30 wt % based on the total weight of the photosensitive resin composition, but is not limited thereto.

In the photosensitive resin composition according to the present invention, examples of the photoinitiator may comprise one or more selected from the group consisting of a triazine compound such as 2,4-trichloromethyl-(4'-methoxyphenyl)-6-triazine, 2,4-trichloromethyl-(4'-methoxystyryl)-6-triazine, 2,4-trichloromethyl-(perfluonyl)-6-triazine, and 2,4-trichloromethyl-(3',4'-dimethoxyphenyl)-6-triazine,3-{4-[2,4-bis(trichloromethyl)-s-triazine-6-yl]phenylthio}propanic acid; a biimidazole compound such as 2,2'-bis(2-chlorophenyl)-4,4',5,5'-tetraphenyl biimidazole and 2,2'-bis(2,3-dichlorophenyl)-4,4',5,5'-tetraphenylbiimidazole; an acetophenone-based compound such as 2-hydroxy-2-methyl-1-phenylpropane-1-on, 1-(4-isopropylphenyl)-2-hydroxy-2-methylpropane-1-on, 4-(2-hydroxyethoxy)-phenyl (2-hydroxy)propyl ketone, 1-hydroxycyclohexyl phenyl ketone, benzoinmethyl ether, benzomethyl ether, benzoinisobutyl ether, benzoinbutyl ether, 2,2-dimethoxy-2-phenyl acetophenone, 2-methyl-(4-methylthiophenyl)-2-morpholino-1-propane-1-on, and 2-benzyl-2-dimethylamino-1-(4-morpholinophenyl)-butane-1-on; a benzophenone-based compound such as benzophenone, 4,4'-bis(dimethylamino)benzophenone, 4,4'-bis(diethylamino)benzophenone, 2,4,6-trimethylaminobenzophenone, methyl-o-benzoylbenzoate, 3,3-dimethyl-4-methoxybenzophenone, and 3,3',4,4'-tetra(t-butylperoxycarbornyl)benzophenone; a fluorenone-based compound such as 9-fluorenone, 2-chloro-9-fluorenone, and 2-methyl-9-fluorenone; a thioxanthone-based compound such as thioxanthone, 2,4-diethyl thioxanthone, 2-chloro thioxanthone, 1-chloro-4-propyloxythioxanthone, isopropyl thioxanthone, and diisopropyl thioxanthone; a xanthone-based compound such as xanthone and 2-methylxanthone; an anthraquinone-based compound such as anthraquinone, 2-methyl anthraquinone, 2-ethyl anthraquinone, t-butyl anthraquinone, and 2,6-dichloro-9,10-anthraquinone; an acrydine-based compound such as 9-phenylacrydine, 1,7-bis(9-acrydinyl)heptane, 1,5-bis(9-acrydinyl)pentane, and 1,3-bis(9-acrydinyl)propane; a dicarbornyl compound such as benzyl, 1,7,7-trimethyl-bischlo[2,2,1]heptane-2,3-dion, and 9,10-phenanthrenequinone; a phosphine oxide-based compound such as 2,4,6-trimethylbenzoyl diphenylphosphine oxide, bis(2,6-dimethoxybenzoyl)-2,4,4-trimethylpentyl phosphine oxide, and bis(2,6-dichlorobenzoyl) propyl phosphine oxide; an amine-based synergist such as methyl 4-(dimethylamino)benzoate, ethyl-4-(dimethylamino)benzoate, 2-n-butoxyethyl 4-(dimethylamino)benzoate, 2,5-bis(4-diethylaminobenzal)cyclopentanone, 2,6-bis(4-diethylaminobenzal)cyclohexanone, and 2,6-bis(4-diethylaminobenzal)-4-methyl-cyclohexanone; a coumarine-based compound such as 3,3,1-carbornylvinyl-7-(diethylamino)coumarine, 3-(2-benzothiazolyl)-7-(diethylamino)coumarine, 3-benzoyl-7-(diethylamino)coumarine, 3-benzoyl-7-methoxycoumarine, and 10,10'-carbornylbis[1,1,7,7-tetramethyl-2,3,6,7-tetrahydro-1H,5H,11H—Cl]-benzopyrano[6,7,8-ij]-quinolizine-11-on; a chalcone compound such as 4-diethylamino chalcone and 4-azidebenzalacetophenone; 2-benzoylmethylene, and 3-methyl-β-naphthothiazoline, but are not limited thereto, and a photoinitiator known in the art may be used.

The content of the photoinitiator is preferably 0.1 to 5 wt % based on the total weight of the photosensitive resin composition, but is not limited thereto.

In the photosensitive resin composition according to the present invention, preferable examples of the solvent comprise one or more selected from the group consisting of acetone, methyl ethyl ketone, methyl isobutyl ketone, methylcellosolve, ethylcellosolve, tetrahydrofuran, 1,4-dioxane, ethyleneglycol dimethyl ether, ethyleneglycol diethyl ether, propyleneglycol dimethyl ether, propyleneglycol diethylether, diethyleneglycol dimethylether, diethyleneglycol diethylether, diethyleneglycol methyl ethyl ether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, 2-ethoxy propanol, 2-methoxy propanol, 3-methoxy butanol, cyclohexanone, cyclopentanone, propyleneglycol methyl ether acetate, propelenglycol ethyl ether acetate, 3-methoxybutyl acetate, ethyl 3-ethoxy propionate, ethyl cellosolveacetate, methyl cellosolveacetate, and butyl acetate, dipropyleneglycol monomethyl ether and the like, but are not limited thereto, and a solvent known in the art may be used.

The content of the solvent is preferably 45 to 95 wt % based on the total weight of the photosensitive resin composition, but is not limited thereto.

Further, the photosensitive resin composition according to the present invention may further comprise one or more selected from the group consisting of a colorant, a curing accelerator, a thermal polymerization inhibitor, a surfactant, a photosensitizer, a plasticizer, an adhesion promoter, a filler and an adhesion auxiliary agent according to the purpose.

One or more pigments, dyes, or mixtures thereof may be used as the colorant. Specifically, metal oxides such as carbon black, graphite, and titanium black may be used as a black pigment. Examples of the carbon black comprise Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon, Co., Ltd.); Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B (Mitsubishi Chemical, Co., Ltd.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa, Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Columbia Carbon, Co., Ltd.), mixtures thereof or the like. Further, examples of the colorant exhibiting a color comprise carmine 6B (C.I. 12490), phthalocyanine green (C.I. 74260), phthalocyanine blue (C.I. 74160), perylene black (BASF K0084. K0086), cyanine black, linol yellow (C.I. 21090), linol yellow GRO(C.I. 21090), benzidine yellow 4T-564D, victoria pure blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7, 36; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; C.I. PIGMENT VIOLET 15, 19, 23, 29, 32, and 37, and the like, and in addition to this, a white pigment, a fluorescent pigment or the like may be used. A material in which zinc is used as the central metal other than copper may be used as the phthalocyanine-based complex compound used as the pigment.

Examples of the curing accelerator may comprise one or more selected from the group consisting of 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate), but are not limited thereto, and may comprise matters that are generally known in the art.

Examples of the thermal polymerization inhibitor may comprise one or more selected from the group consisting of p-anisole, hydroquinone, pyrocatechol, t-butyl catechol, N-nitrosophenylhydroxyamine ammonium salts, N-nitrosophenylhydroxyamine aluminum salts and phenothiazine, but are not limited thereto and may comprise matters that are generally known in the art.

All compounds that can be comprised in a known photosensitive resin composition may be used as the surfactant, the photosensitizer, the plasticizer, the adhesion promoter, the filler and the like.

The content of the colorant is preferably 1 to 20 wt % based on the total weight of the photosensitive resin composition, and the contents of the other additives are each independently preferably 0.01 to 5 wt % based on the total weight of the photosensitive resin composition, but are not limited thereto.

Meanwhile, the photosensitive resin composition according to the present invention may be used in a roll coater, a curtain coater, a spin coater, a slot die coater, various printings and precipitations and the like, and may be applied on a support such as metal, paper, glass, and plastic substrates. Further, after being applied on the support such as the film, the composition may be transferred on the other support, or the composition may be applied on a first support, transferred on a blanket, and transferred on a second support, and the application method thereof is not particularly limited.

Examples of a light source for curing the photosensitive resin composition according to the present invention comprise a mercury vapor arc, a carbon arc, a Xe arc and the like emitting light having a wavelength of 250 to 450 nm, but are not necessarily limited thereto.

The photosensitive resin composition comprising the polymer according to the present invention has excellent photosensitivity and developing property, a high taper angle and excellent adhesion strength. Accordingly, the photosensitive resin composition comprising the polymer according to the present invention may be applied to various photosensitive materials, and particularly, may be preferably applied when a color filter pattern for LCD is manufactured.

Further, the present invention provides a photosensitive material comprising the photosensitive resin composition.

The photosensitive resin composition according to the present invention is preferably used in a pigment dispersion type photosensitive material for manufacturing a TFT LCD color filter, a photosensitive material for forming a black matrix of a TFT LCD or organic light emitting diode, a photosensitive material for forming an overcoat layer, and a column spacer photosensitive material, but may be used in manufacturing a photosensitive material for a photocurable paint, photocurable ink, photocurable adhesive, a printed board, and a printed circuit board, and other transparent photosensitive materials and PDPs, and the purpose thereof is not particularly limited.

MODE FOR INVENTION

A better understanding of the present invention may be obtained in light of the following Examples which are set forth to illustrate, but are not to be construed to limit the present invention.

EXAMPLE

Synthetic Example 1

18 g of benzyl methacrylate, 3 g of N-phenyl maleimide, 2 g of styrene, 7 g of methacrylic acid, 9 g of n-decyl methacrylate, 10 g of 1-adamantyl methacrylate, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours (Mw: 19,000 g/mol and Av: 100 mgKOH/g).

Synthetic Example 2

18 g of benzyl methacrylate, 3 g of N-phenyl maleimide, 2 g of styrene, 7 g of methacrylic acid, 9 g of n-octyl methacrylate, 10 g of dicyclopentenyloxyethyl methacrylate, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours (Mw: 21,000 g/mol and Av: 100 mgKOH/g).

Synthetic Example 3

18 g of benzyl methacrylate, 3 g of N-phenyl maleimide, 2 g of methylstyrene, 7 g of acrylic acid, 9 g of n-lauryl methacrylate, 10 g of adamantyl methacrylate, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours (Mw: 21,000 g/mol and Av: 100 mgKOH/g).

Synthetic Example 4

18 g of benzyl methacrylate, 3 g of N-phenyl maleimide, 2 g of methylstyrene, 7 g of acrylic acid, 9 g of n-lauryl methacrylate, 10 g of dicyclopentenyl methacrylate, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours (Mw: 21,000 g/mol and Av: 100 mgKOH/g).

Comparative Synthetic Example 1

28 g of benzyl methacrylate, 5 g of N-phenyl maleimide, 3 g of styrene, 7 g of methacrylic acid, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours (Mw: 15,000 g/mol and Av: 100 mgKOH/g).

Comparative Synthetic Example 2

31 g of benzyl methacrylate, 18 g of methacrylic acid, 0.3 g of 3-mercaptopropionic acid that was the chain transfer agent, and 137 g of acetic acid 3-methoxy ester that was the solvent were mixed by the mechanical stirrer under the nitrogen atmosphere for 30 min. The temperature of the reactor was increased to 70° C. under the nitrogen atmosphere, and when the temperature of the mixture was 70° C., 1.3 g of AIBN that was the thermal polymerization initiator was added and stirred for 15 hours. The temperature of the reactor where the polymer was polymerized was increased to 80° C., 0.1 g of tetrabutylammonium bromide and 0.05 g of MEHQ that was the thermal polymerization inhibitor were added and stirred for 30 min, 10 g of glycidyl methacrylate was added to the polymer solution and additionally stirred at 120° C. for 12 hours to complete synthesis of the desired resin (Mw: 17,000 g/mol and Av: 70 mgKOH/g).

Example 1

53 parts by weight of millbase for a black matrix, 3 parts by weight of the acryl-based resin of Synthetic Example 1 as the binder, 3 parts by weight of dipentaerythritol hexaacrylate as the polymerizable compound, 1 part by weight of the total photopolymerization initiator and 40 parts by weight of PGMEA as the organic solvent were mixed by using the shaker for 3 hours in order to evaluate characteristics of the binder resin.

Example 2

The same procedure as Example 1 was performed, except that the acryl-based resin of Synthetic Example 2 was used as the binder instead of the acryl-based resin of Synthetic Example 1.

Example 3

The same procedure as Example 1 was performed, except that the acryl-based resin of Synthetic Example 3 was used as the binder instead of the acryl-based resin of Synthetic Example 1.

Example 4

The same procedure as Example 1 was performed, except that the acryl-based resin of Synthetic Example 4 was used as the binder instead of the acryl-based resin of Synthetic Example 1.

Comparative Example 1

53 parts by weight of millbase for a black matrix, 3 parts by weight of the acryl-based resin of Comparative Synthetic Example 1 as the binder, 3 parts by weight of dipentaerythritol hexaacrylate as the polymerizable compound, 1 part by weight of the total photopolymerization initiator and 40 parts by weight of PGMEA as the organic solvent were mixed by using the shaker for 3 hours in order to evaluate characteristics of the binder resin.

Comparative Example 2

The same procedure as Comparative Example 1 was performed, except that the acryl-based resin of Comparative Synthetic Example 2 was used as the binder instead of the acryl-based resin of Comparative Synthetic Example 1.

Experimental Example

1) PCT Adhesion Strength

Figure 2:
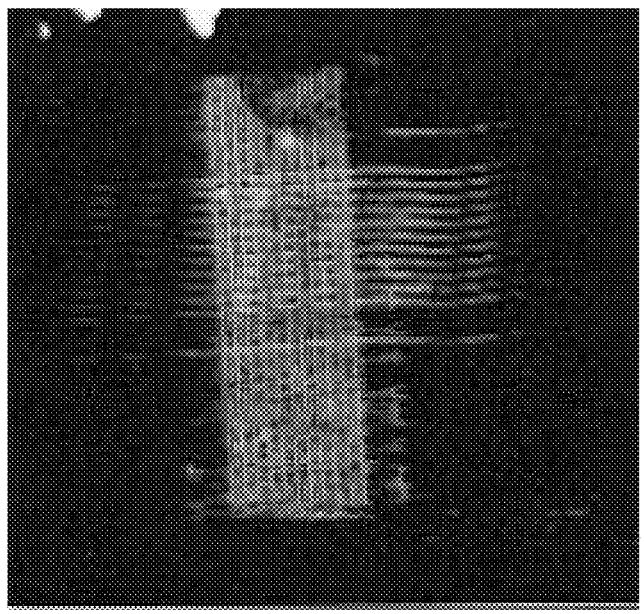
FIG. 2 is a view illustrating a test result of adhesion strength of a film according to Example 2 of the present invention.
Figure 3:
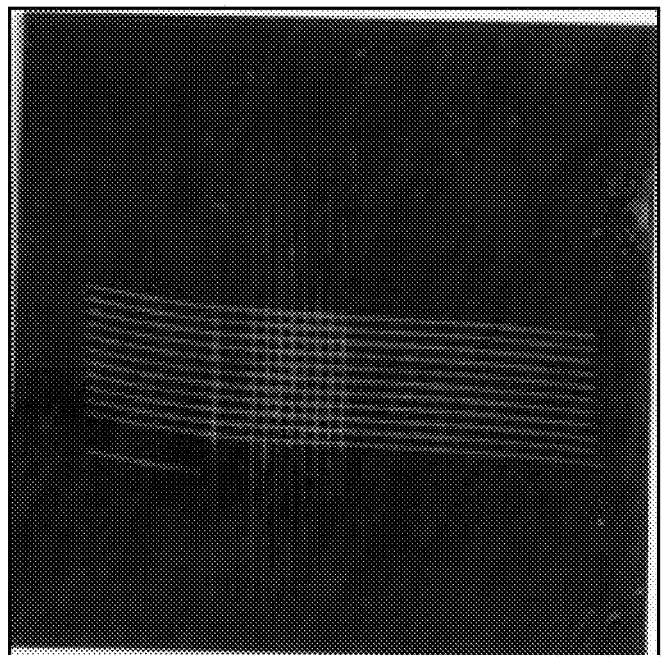
FIG. 3 is a view illustrating a test result of adhesion strength of a film according to Example 3 of the present invention.
Figure 4:
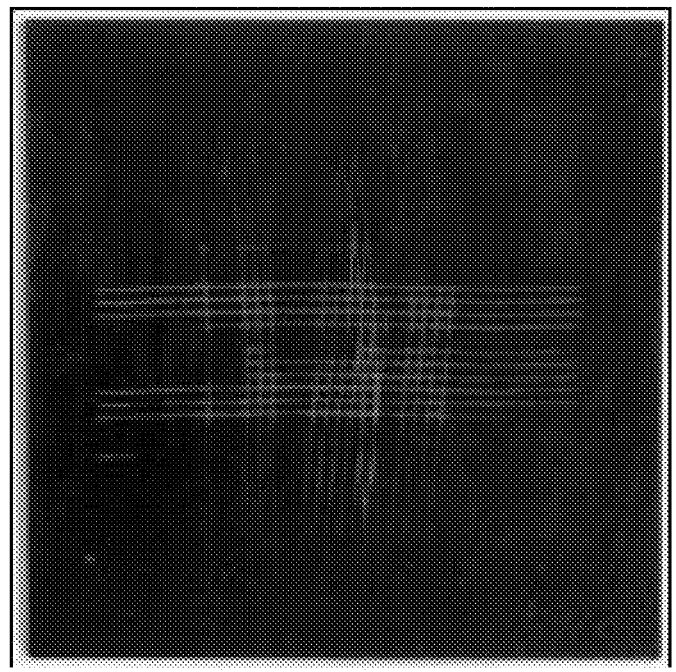
FIG. 4 is a view illustrating a test result of adhesion strength of a film according to Example 4 of the present invention.
Figure 5:
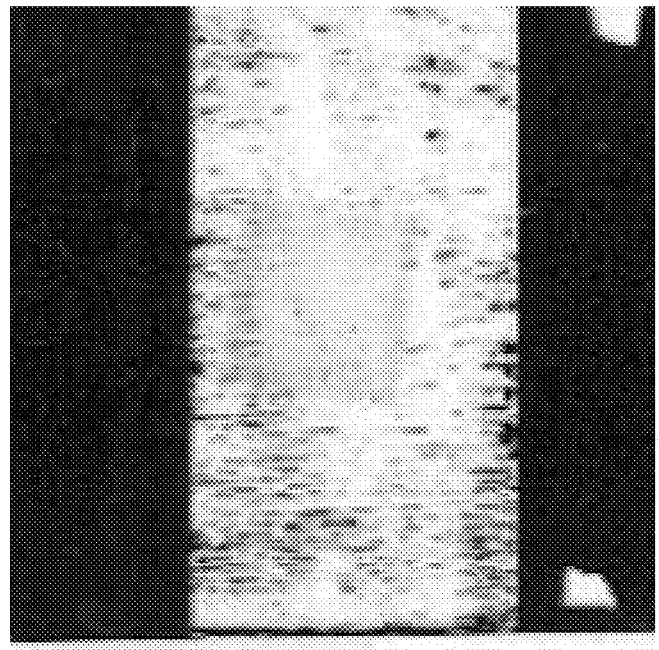
FIG. 5 is a view illustrating a test result of adhesion strength of a film according to Comparative Example 1 of the present invention.
Figure 6:
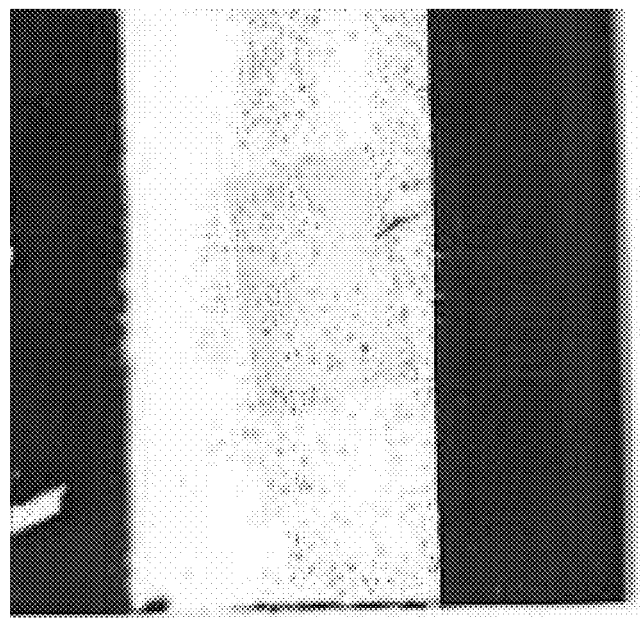
FIG. 6 is a view illustrating a test result of adhesion strength of a film according to Comparative Example 2 of the present invention.

The photoresist was applied on glass, and subjected to VCD, prebake, exposure, and postbake to manufacture the black matrix film. After the manufactured film was added to HASTEST PC-III and treated at 120° C. and humidity of 100% under the pressure of 2 atm for 8 hours, adhesion strength of the film was confirmed in a high temperature and humidity environment through a tape filling test (after a scratch of a lattice pattern was formed in the film, Nichiban tape of 24 mm was attached and then removed at a predetermined angle). The test results of the adhesion strength are shown in the following FIGS. 1 to 6.

Through the aforementioned experiments, it can be confirmed that Examples 1 to 4 have even excellent adhesion strength in a high temperature and humidity environment as compared to Comparative Examples 1 to 2.

2) Pattern Shape-Taper Angle

Figure 7:
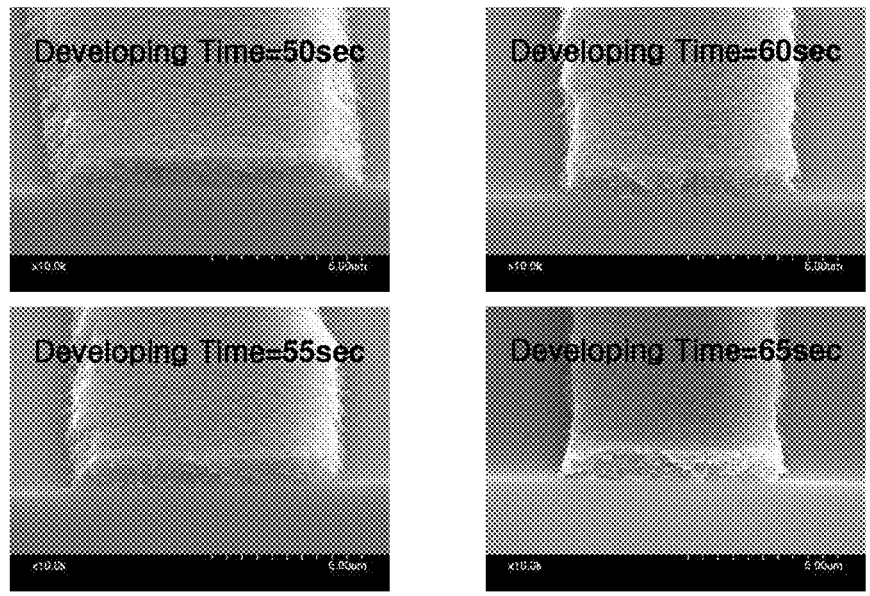
FIG. 7 is a view illustrating a shape of a pattern of the film according to Example 1 of the present invention.
Figure 8:
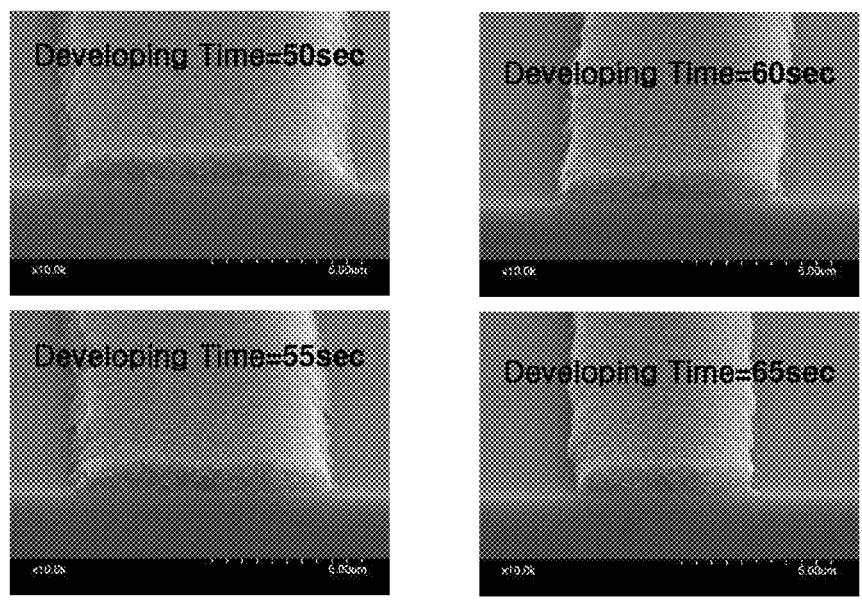
FIG. 8 is a view illustrating a shape of a pattern of the film according to Example 2 of the present invention.
Figure 9:
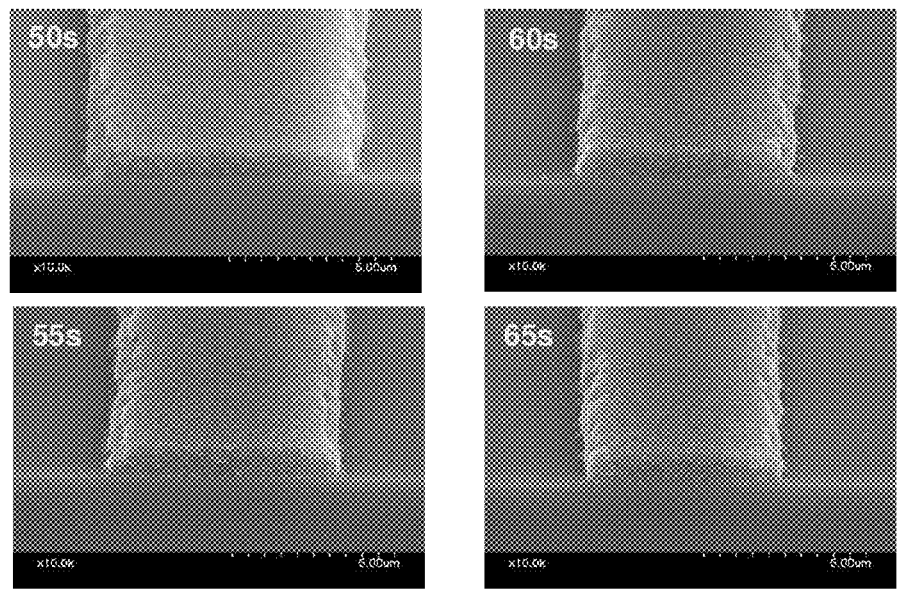
FIG. 9 is a view illustrating a shape of a pattern of the film according to Example 3 of the present invention.
Figure 10:
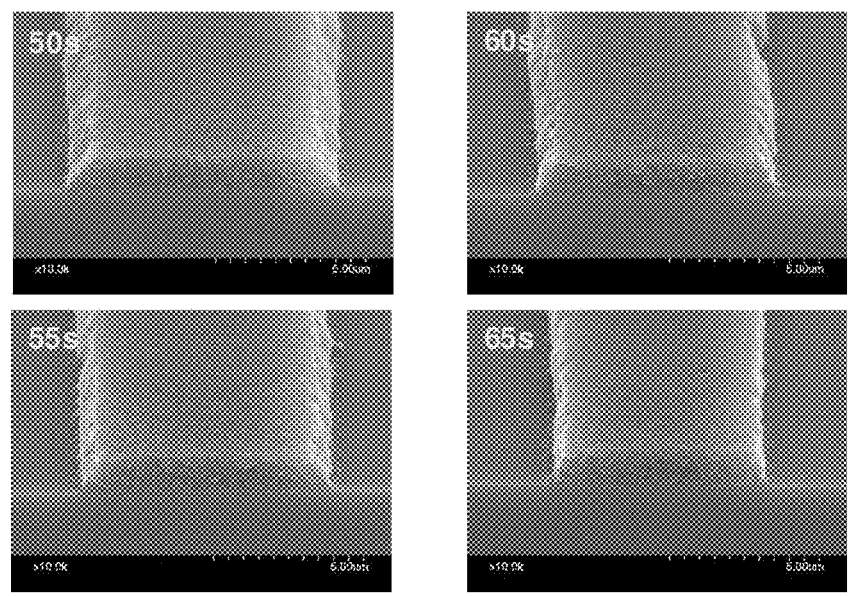
FIG. 10 is a view illustrating a shape of a pattern of the film according to Example 4 of the present invention.
Figure 11:
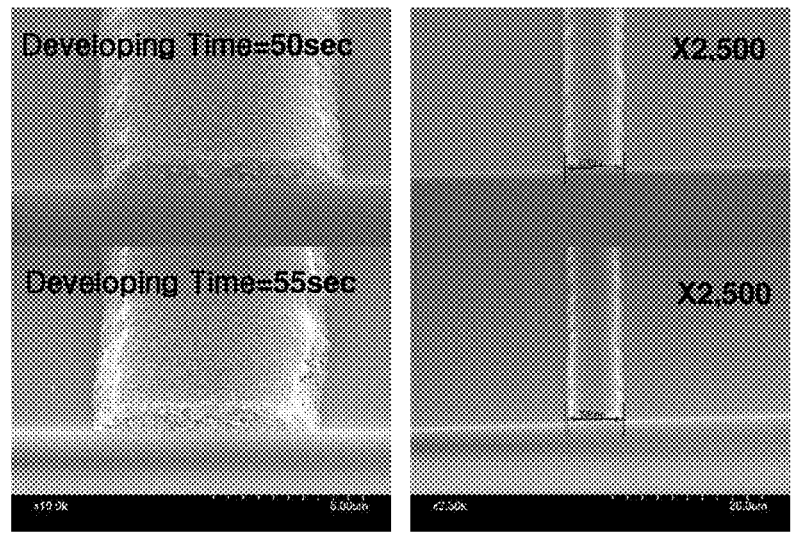
FIG. 11 is a view illustrating a shape of a pattern of the film according to Comparative Example 1 of the present invention.
Figure 12:
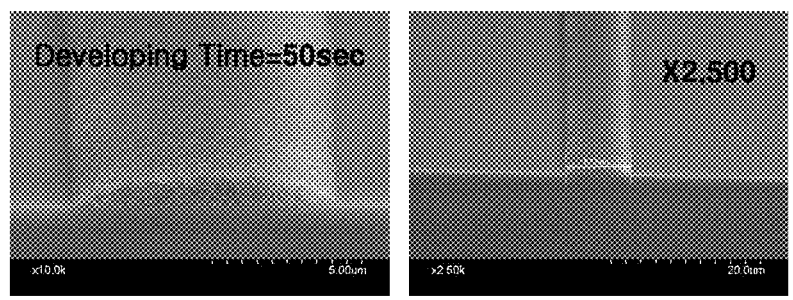
FIG. 12 is a view illustrating a shape of a pattern of the film according to Comparative Example 2 of the present invention.

The photoresist was applied on glass, and subjected to VCD, prebake, and exposure, the pattern was formed while the developing time was changed, and postbake was performed to manufacture the black matrix pattern. The shape of the pattern was measured by using the SEM, and the result thereof is shown in the following FIGS. 7 to 12.

The shape of the pattern was excellent in Examples 1 to 4, but there are problems in that the pattern was eliminated after 55 sec in Comparative Example 1 and the pattern was eliminated after 50 sec in Comparative Example 2.

Through the aforementioned results, it can be confirmed that in the case where the photosensitive resin composition comprising the polymer according to the present invention is used, a developing margin is broadened and a pattern having an erect shape is formed.

The invention claimed is:

1. A polymer comprising:
1) a repeating unit represented by the following Formula 1;
2) a repeating unit represented by the following Formula 2;
3) a repeating unit represented by the following Formula 3;
4) a repeating unit represented by the following Formula 4;
5) a repeating unit represented by the following Formula 5; and
6) a repeating unit represented by the following Formula 6:

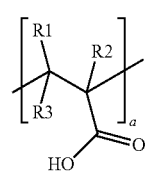

[Formula 1]

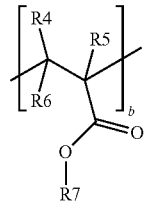

[Formula 2]

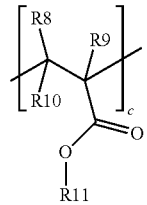

[Formula 3]

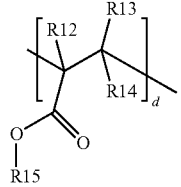

[Formula 4]

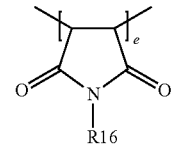

[Formula 5]

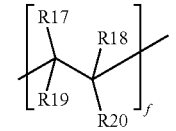

[Formula 6]

wherein,

R1, R2, R3, R4, R5, R6, R8, R9, R10, R2, R13, R14, R17, R18 and R19 are the same as or different from each other, and each independently hydrogen or a $C_1$ to $C_{12}$ alkyl group, R7 is a $C_8$ to $C_{18}$ alkyl group, R11 is a dicyclopentanyl group, a dicyclopentenyl group, a dicyclopentenyloxyethyl group, an adamantyl group or an isobornyl group, R15 is a $C_1$ to $C_{12}$ alkyl group which is unsubstituted or substituted by halogen, a $C_6$ to $C_{20}$ aryl group or a $C_1$ to $C_{12}$ alkoxy group; a C1 to C3 alkoxy polyalkylene glycol group having 2 to 30 alkoxyl repeat units; or a $C_6$ to $C_{20}$ aryl group which is unsubstituted or substituted by halogen, a $C_1$ to $C_{12}$ alkyl group or a $C_1$ to $C_{12}$ alkoxy, R16 is a $C_1$ to $C_{12}$ alkyl group which is unsubstituted or substituted by halogen, a $C_6$ to $C_{20}$ aryl group or a $C_1$ to $C_{12}$ alkoxy group; a $C_1$ to $C_{12}$ alkylester group; or a $C_6$ to $C_{20}$ aryl group which is unsubstituted or substituted by halogen, a $C_1$ to $C_{12}$ alkyl group, a $C_6$ to $C_{20}$ aryl group or a $C_1$ to $C_{12}$ alkoxy, R20 is a $C_6$ to $C_{20}$ aryl group which is unsubstituted or substituted by halogen, a $C_1$ to $C_{12}$ alkyl group, a $C_6$ to $C_{20}$ aryl group or a $C_1$ to $C_{12}$ alkoxy group, a is 10 to 60, b is 10 to 60, c is 10 to 60, d is 1 to 90, e is 1 to 30, and f is 1 to 30.

2. The polymer of claim 1, wherein the polymer is represented by the following Formula 7:

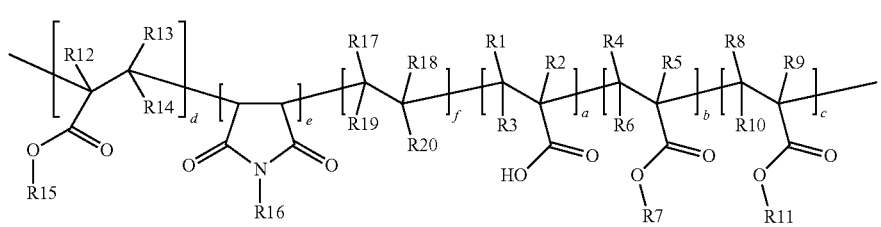

[Formula 7]

wherein R1 to R20, and a to f are the same as definitions of Formula 1 to Formula 6.

3. The polymer of claim 1, wherein an acid value of the polymer is in the range of 30 to 300 KOH mg/g.

4. The polymer of claim 1, wherein a weight average molecular weight of the polymer is in the range of 5,000 to 50,000.

5. A photosensitive resin composition comprising:
a binder resin comprising the polymer of claim 1,
a polymerizable compound comprising an ethylenically unsaturated bond,
a photoinitiator, and
a solvent.

6. The photosensitive resin composition of claim 5, wherein a content of the binder resin is 1 to 20 wt % based on a total weight of the photosensitive resin composition.

7. The photosensitive resin composition of claim 5, wherein a content of the polymerizable compound comprising the ethylenically unsaturated bond is 1 to 30 wt %, a content of the photoinitiator is 0.1 to 5 wt %, and a content of the solvent is 45 to 95 wt % based on a total weight of the photosensitive resin composition.

8. The photosensitive resin composition of claim 5, further comprising:
one or more selected from the group consisting of a colorant, a curing accelerator, a thermal polymerization inhibitor, a surfactant, a photosensitizer, a plasticizer, an adhesion promotor, a filler and an adhesion auxiliary agent.

9. A photosensitive material comprising:
the photosensitive resin composition of claim 5.

10. The photosensitive material of claim 9, wherein the photosensitive material is selected from the group consisting of a pigment dispersion type photosensitive material for manufacturing a color filter, a photosensitive material for forming a black matrix, a photosensitive material for forming an overcoat layer, a column spacer photosensitive material and a photosensitive material for a printed circuit board.

11. A photosensitive resin composition comprising:
a binder resin comprising the polymer of claim 2,
a polymerizable compound comprising an ethylenically unsaturated bond,
a photoinitiator, and
a solvent.

12. A photosensitive resin composition comprising:
a binder resin comprising the polymer of claim 3,
a polymerizable compound comprising an ethylenically unsaturated bond,
a photoinitiator, and
a solvent.

13. A photosensitive resin composition comprising:
a binder resin comprising the polymer of claim 4,
a polymerizable compound comprising an ethylenically unsaturated bond,
a photoinitiator, and
a solvent.

* * * * *

UNITED STATES PATENT AND TRADEMARK OFFICE
CERTIFICATE OF CORRECTION

PATENT NO.       : 8,829,068 B2
APPLICATION NO.  : 13/452456
DATED            : September 9, 2014
INVENTOR(S)      : Sunhwa Kim et al.

Page 1 of 1

It is certified that error appears in the above-identified patent and that said Letters Patent is hereby corrected as shown below:

In The Claims

Claim 1, Col. 12, line 42, "R10, R2, R13" should read "R10, R12, R13".

Signed and Sealed this
Twenty-seventh Day of January, 2015

Michelle K. Lee
*Deputy Director of the United States Patent and Trademark Office*